United States Patent [19]
Turney et al.

[11] Patent Number: 5,389,927
[45] Date of Patent: Feb. 14, 1995

[54] METHOD AND APPARATUS FOR CONTROL OF AN ANALOG TO DIGITAL CONVERTER

[75] Inventors: William J. Turney, Schaumburg; Paul H. Gailus, Prospect Heights; Mark A. Gannon, Sleepy Hollow, all of Ill.

[73] Assignee: Motorola, Inc., Schaumburg, Ill.

[21] Appl. No.: 68,324

[22] Filed: May 28, 1993

[51] Int. Cl.⁶ .............................................. H03M 1/18
[52] U.S. Cl. ...................................... 341/139; 341/138
[58] Field of Search .................. 341/139, 143, 155, 138

[56] References Cited

U.S. PATENT DOCUMENTS

| | | | |
|---|---|---|---|
| 4,099,174 | 4/1978 | Svensson | 341/139 |
| 4,383,247 | 5/1983 | Assard | 341/139 |
| 4,625,240 | 11/1986 | Yablonski et al. | 358/143 |
| 4,857,928 | 8/1989 | Gailus et al. | 341/143 |
| 4,875,049 | 10/1989 | Yoshida | 341/159 |
| 4,901,078 | 2/1990 | Goyal | 341/163 |
| 4,975,701 | 12/1990 | Babamezhad et al | 341/139 |
| 5,170,166 | 12/1992 | Tanaka et al. | 341/139 |
| 5,243,625 | 9/1993 | Verbalcel et al. | 375/17 |

*Primary Examiner*—Marc S. Hoff
*Attorney, Agent, or Firm*—Susan L. Lukasik; Steven G. Parmelee; Wayne J. Egan

[57] ABSTRACT

An analog signal having an input level is provided. The analog signal is converted into a digitized representation of the analog signal in an analog to digital converter (105) that uses an operating range. The digitized representation of the analog signal is processed (107) to determine the input level for the analog signal. The input level for the analog signal is compared (109) with a reference signal to provide a comparison signal. The comparison signal is manipulated (111) to adjust the operating range.

25 Claims, 1 Drawing Sheet

METHOD AND APPARATUS FOR CONTROL OF AN ANALOG TO DIGITAL CONVERTER

FIELD OF THE INVENTION

This invention relates to radio frequency receivers, including but not limited to automatic gain control in digital radio frequency receivers.

BACKGROUND OF THE INVENTION

Automatic Gain Controllers (AGCs) are typically used for two reasons: 1) in a receiver, to prevent saturation of one or more stages which is caused by exceeding the dynamic range of a stage by a large input signals, and 2) to keep the average output level of some type of acoustical means (e.g., a speaker) nearly constant in the presence of a signal whose power level is varying. Techniques for achieving the above are well known for both analog and digital construction of radio frequency (RF) receivers. Known techniques, however, result in a receiver with a significant reduction in noise figure, which results in loss in sensitivity, and/or a receiver with a significant loss in dynamic range because the AGC reduces the linearity of the stage that is gain controlled.

Many advantages of using digital signal processing as applied to RF receivers are well known. It is also well known that a major limitation in the application of digital signal processing techniques in RF receivers is the limited dynamic range of the analog-to-digital converter (ADC) and/or the large noise floor of the ADC. One notable advantage of using digital signal processing is the ability to have well-controlled filters, and the ability to easily change filter characteristics for different types of communication systems. If an RF receiver functions within several different types of communication systems, any analog selectivity before the ADC must have sufficient bandwidth to support the signal with the largest bandwidth that the system must support. Hence, the RF receiver system, and in particular the ADC, must have a dynamic range large enough to allow the receiver to handle multiple signals simultaneously (e.g., a desired signal and an adjacent channel signal). At present, an ADC is not known that has a dynamic range large enough to support the needs of a land mobile communication system without the use of some type of AGC. Ideally, the type of AGC used should result in minimum impairment to noise figure and dynamic range of the system.

A particular type of ADC that is well-suited for narrow band radio communication systems is a sigma delta converter. Sigma delta converters are capable of being gain controlled. A known AGC apparatus is a digital feed-forward AGC that follows the ADC, where the ADC has sufficient dynamic range to cover the system's needs.

Applying AGC techniques to digital receivers as well as control of front end gain and digital gain is well known. The control of front end gain overcomes the problem of insufficient dynamic range of the ADC. Nevertheless, known techniques using analog gain reduction result in a reduction of the linearity of the receiver's front end analog circuits. Thus, dynamic range may be reduced due to intermodulation when multiple signals are present.

Various AGC techniques exist that are used with both analog and digital receivers. These techniques result in either a limited front end gain or requiring that the ADC be capable of supporting the entire dynamic range, again resulting in potential dynamic range loss due to receiver front end linearity reduction.

Accordingly, there is a need for an AGC or similar technique in a digital setting which has good noise figure, good receiver sensitivity, limited noise contribution from the AGC, and no significant loss in dynamic range.

DESCRIPTION OF A PREFERRED EMBODIMENT

The following describes an apparatus for and method of providing an Operating Range Adjustment Device (ORAD) for a digital receiver with minimum impairment to the noise figure and linearity of the receiver's front end. This ORAD system is substantially digitally controlled and has the following characteristics: digitally derived fast attack, slow decay, digitally derived operating range adjustment control, a digitally derived adjustable reference, and the ability to enable operation in the land mobile environment when signals with Rayleigh faded envelopes are present.

Signals must be kept below the clip point of the ADC or severe impairment to the signal can result, especially if a multiplicity of signals are present simultaneously (e.g., a desired signal and an adjacent channel signal). The ADC is kept from dipping by controlling the level of the clip point with an automatic control loop, as provided by an ORAD. If the clip point of the ADC is kept some fixed level above an obtainable signal parameter, e.g., the signal's average value, the output of the ADC will have this parometer held constant with respect to clip. The dynamic range of an ADC is kept constant by varying the clip level since the level of the quantization noise also increases when the clip point is increased. If the receiver's front end gain is fixed, no impairment to the linearity of the receiver will result by using this method.

Figure 1:
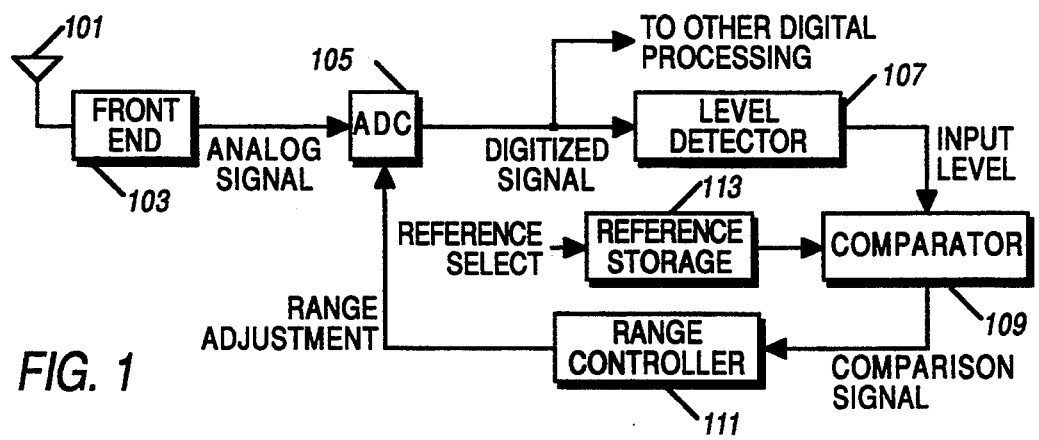
FIG. 1 is a receiver showing an operating range adjustment device for an ADC in accordance with the invention.

A receiver showing an ORAD for an ADC is shown in FIG. 1. An RF signal is received through an antenna 101 and frequency translated and otherwise processed as necessary by front end block 103 to yield an analog signal having an input level. The analog signal is converted from an analog signal to a digital signal in an ADC 105 having a range adjustment input. The ADC 105 may be a sigma delta converter, as used in the preferred embodiment, and described in U.S. Pat. No. 4,857,928, by Paul H. Gailus et al., titled "Method and Arrangement for a Sigma Delta Converter for Bandpass Signals," which is incorporated herein by reference. Using U.S. Pat. No. 4,857,928 as an example, the range adjustment input to the ADC would replace reference numeral 230 in FIG. 1. The ADC 105 may also be another type, such as a flash ADC as is known in the art, although as one skilled in the art can appreciate, any other type of ADC whose clip level is controllable may be employed. The ADC 105 uses an operating range to convert the signal, wherein the operating range is increased or decreased according to the range adjustment signal input to the ADC 105. The input clip point of the ADC 105 is the value of the analog signal present at the analog signal input of the ADC that corresponds to a full scale digital output. An input clip point is always present in an ADC by its nature. An input analog signal larger than the input clip point is represented by a full scale digital output as well, which creates distortion of the digitized signal output. The operating range of the A/D refers to the range in level of analog input signals between the input clip point as the upper limit and the ADC 105 quantization noise as the lower limit. The very nature of an ADC causes a quantization noise floor to be present. The ADC 105 outputs a digitized signal which is a digitized representation of the analog signal. The digitized signal is used for other digital processing including demodulation, speech processing, encryption, and so forth.

Figure 2:
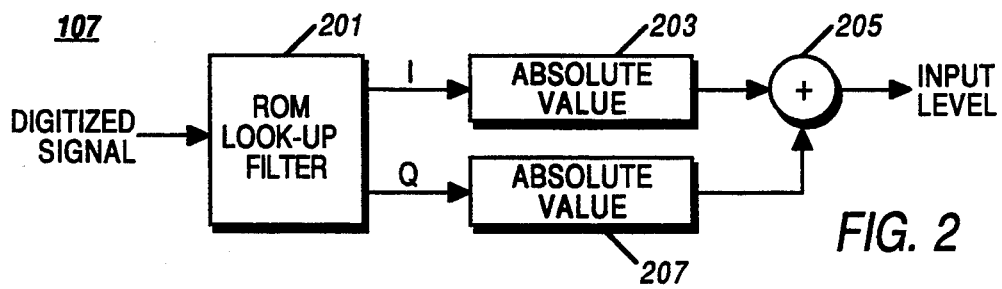
FIG. 2 is a level detector in accordance with the invention.

The digitized signal is processed in a level detector 107 to determine the input level for the analog signal, as shown in FIG. 2 and its associated text below. The input level is input to a conventional comparator 109, which compares the input level for the analog signal with a reference signal from reference storage 113 by command of a reference select signal from a microprocessor or other similar device, thus providing a comparison signal to a range controller 111. The comparison signal is the difference between the input level signal and the reference signal. The reference signal establishes the relationship of the analog signal input to the ADC 105 input clip point, as described below. The optimal reference for highest dynamic range of the ADC 105 depends upon the type of modulation that is being used. This reference is determined by subtracting the peak to average value of the signal from a fixed value which is dependent upon the implementation of the ADC 105. This invention allows for a multiplicity of references to be stored, thereby accommodating a multiplicity of modulation types. In the preferred embodiment, multiple references are provided via software control. The range controller uses the comparison signal to adjust the operating range of the ADC 105 via the range adjustment signal, as shown in FIG. 3 and its associated text below.

A level detector 107 is shown in FIG. 2. The level detector determines the level of the digitized signal output. The digitized signal from the ADC 105 is input to a ROM look-up filter 201, which provides an in-phase component, I, and a quadrature component, Q, of the digitized signal. The ROM look-up filter 201 is one type of filter before the actual level detecting means that reduces the amount of undesired noise being detected. Such filtering is especially desirable if the ADC if of the sigma delta type. The filter bandwidth in the ROM look-up filter 20 1 is substantially wider than the dosed-loop bandwidth of the ORAD, as discussed later, to keep this filter from affecting the ORAD's transient response and so as to pass as wide a range in frequency as possible signals which get coupled to the level detector and hence can activate the OPAl) so that analog signals with a wide range in frequency can be placed within the operating range of ADC 105. The absolute value of I is computed by an absolute value block 203. The absolute value of Q is computed by an absolute value block 207. The absolute value of I and the absolute value of Q are added by adder 205, the result of which is the input level signal, as described above for FIG. 1. An alternative embodiment of the level detector 107 is a digital squaring means, the output of which is proportional to the square of its input. Those skilled in the art can appreciate that many other successful embodiments of a level detector exist.

Figure 3:
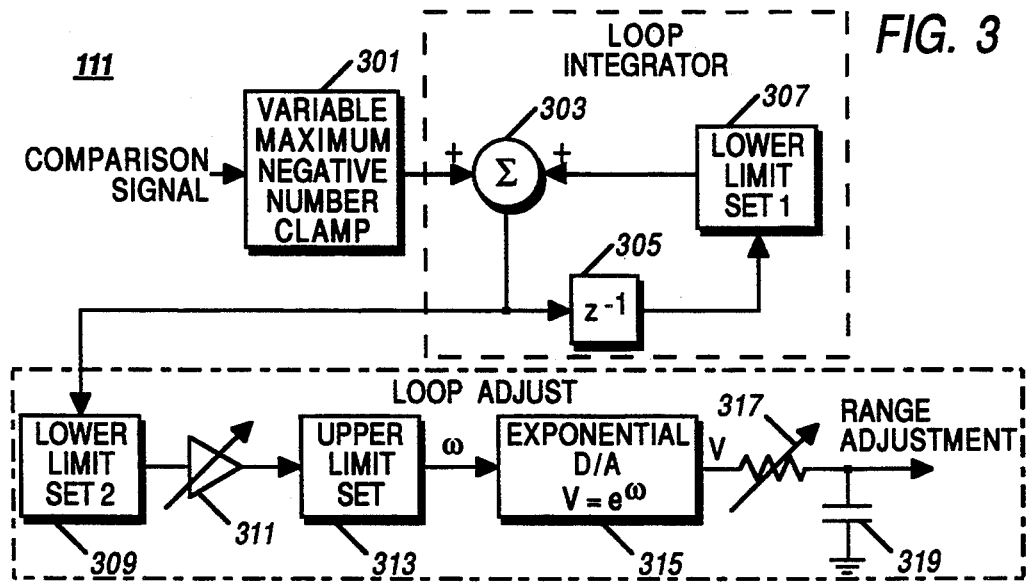
FIG. 3 is a range controller in accordance with the invention.

A range controller 111 is shown in FIG. 3. The range controller functions to ultimately produce the range adjustment signal that is coupled to the range adjustment input of the ADC 105. The comparison signal from the comparator 109 is input to a variable maxim,m negative number clamp 301. The output of the variable maximum negative number clamp 301 is input to a loop integrator, which is comprised of a summer 303, a delay block 305, and a first lower limit set device 307. The loop integrator provides a substantial amount of filtering. The output of the loop integrator is coupled to a loop adjust block, which is comprised of a second lower limit set device 309, a loop gain set amplifier 311, an upper limit set device 313, an exponential digital to analog (D/A) block 315, and a variable resistor 317 and capacitor 319. The loop adjust block outputs the range adjustment signal to the ADC 105, as described above for FIG. 1.

The combination of the loop integrator and loop gain set amplifier 311 within the range controller sets the closed loop transient response of the ORAD. The loop gain set block and hence the ORAD closed-loop bandwidth are programmable via software in the preferred embodiment to provide for optimum transient response to different input analog signal types. One practical way to implement adjustable gain is by adjusting the gain by factors of two by performing bit shifting as implemented in the preferred embodiment.

The variable maxim negative number clamp 301 clamps its maximum negative output to a programmable value. If this value is less than the instant value of the comparison signal, the output of the loop integrator, and hence the range adjustment signal, will decrease more slowly than if the maximum negative number clamp 301 output equaled the instant value of the comparison signal. A negative value of the comparison signal corresponds to ORAD action to reduce the range adjustment signal. As described, the maximum negative number clamp 30 1 slows the rate of decay of the range adjustment signal, and hence implements an ORAD that has slower decay time to negative comparison signals than attack time to positive comparison signals. The variable maximum number clamp 301 provides for a digital implementation of a fast attack, slow decay ORAD in the preferred embodiment.

The lower limit set devices 307 and 309 are used to implement a delayed ORAD. The employment of the second lower limit set device 309 provides a lower limit to the range adjustment signal to the ADC 105. A delayed AGC, as is known in the art, does not activate gain control until after the signal it operates on is at a minimum level. In the present invention, a delayed ORAD works in a similar fashion in that the delayed ORAD does not activate operating range adjustment until the comparison signal exceeds the value set by the second lower limit set device 309. The second lower limit set device 309 is useful to maximize the operating range of the ADC 105, as in most practical ADCs, the noise floor cannot be continuously reduced with continuous reduction of the range adjustment signal. The limit of the first lower limit set device 307 placed within the loop integrator coincides with the limit of the second lower limit device 309 such that when the second lower limit device 309 is at its limit, the output of the loop integrator is constant and preferably at the same value as the limit of the second lower limit set device 309. The function of the first lower limit device 307 prevents the internal state of the loop integrator from accumulating increasingly larger negative values with constantly negative comparison signals resulting from sufficiently small analog signals. This limiting provides for enhanced ORAD response time to analog signals that change from being sufficiently small to sufficiently large enough to create positive comparison signals.

In the preferred embodiment, the range adjustment input to the ADC 105 is analog. All previous devices which directly couple to the range controller 111 or indirectly couple to the range controller 111 are digital in nature. In the preferred embodiment, these analog/digital natures result in the advantage of the use of a D/A (digital to analog converter) with a substantially exponential transfer function creating a closed-loop frequency response of the ORAD that is substantially independent of input signal level. In the preferred embodiment, the substantially exponential D/A function is performed with a piece-wise linear exponential D/A 315, where the output is approximately represented as $V = e^{107}$. The individual components of the ORAD can be analog or digital, depending on the method of implementing the function of the individual components, as one skilled in the art would recognize. The exponential D/A 315 is proceeded by an upper limit set device 313, which is used to limit the maximum value of the range adjustment signal to limit the increase of the ADC 105 clip point provided by the ORAD. This upper limit set device 313 is provided since, as one skilled in the art can appreciate, there are circuit constraints on the maximum attainable amount of range adjustment signal.

In the preferred embodiment, the output of the exponential D/A 315 is followed by a degree of analog filtering before being coupled to the range adjustment input of the ADC 105. The filtering is provided to minimize the additional noise coupled to the ADC 105 via D/A switching noise on the range adjustment signal. The filtering also prevents non-linearities due to D/A switching noise in the range adjustment signal from operating upon a multiplicity of analog signal inputs (e.g., a desired signal and adjacent channel signal) causing an undesired signal to corrupt a desired signal.

In the preferred embodiment, the analog filter bandwidth is adjustable and is programmed to be wider when the ORAD closed-loop bandwidth is programmed wider via changing the loop gain set amplifier 311. This programmable adjustable bandwidth is used so that the ORAD's closed loop transient response is determined primarily by the loop integrator and loop gain set amplifier 311 and is not significantly affected by the analog filter.

In the preferred embodiment, the range controller sets limits on its output in such a way as to maximize the ADC 105 operating range. The limits are set such that there is no affect on the transient response of the ORAD by adding appreciable delay due to the limit setting. The overall function of the present invention is to provide an ADC with a clip point above the level of the analog signal. The amount the ADC clip point extends above the analog signal is dependent upon the reference input of the comparator 109. If an analog signal with a level corresponding to the ADC clip is present and produces an input level of X, then the ORAD provides for the ADC clip to extend above any analog signal level by the amount the reference input of the comparator 109 is below X, as long as the corresponding range adjustment signal is within the bounds placed by the second lower limit set device 309 and upper limit set device 313 in the range controller.

What is claimed is:

1. A device comprising:
   A) an analog to digital converter having an analog signal input, a digitized signal output, and a range adjustment input;
   B) a level detector coupled to the digitized signal output and having a level detector output that yields an input level signal;
   C) a comparator having at least a first input coupled to the level detector output, a second input coupled to a reference, and a comparison signal output; and
   D) a range controller having an input coupled to the comparison signal output and an output coupled to the range adjustment input, such that the range controller adjusts the range of acceptable peak magnitude analog signals over which the analog to digital converter converts analog signals into digital signals.

2. The device of claim 1, wherein the level detector further comprises:
   B1) a read-only memory look-up filter which provides an in-phase component and a quadrature component of a digitized signal;
   B2) a first means, coupled to the read-only memory look-up filter, for taking an absolute value of the in-phase component, providing an absolute in-phase signal;
   B3) a second means, coupled to the read-only memory look-up filter, for taking an absolute value of the quadrature component, providing an absolute quadrature signal;
   B4) means for adding the absolute in-phase signal and the absolute quadrature signal yielding the input level signal.

3. The device of claim 1, wherein the range controller output provides a digital implementation of a fast attack, slow decay operating range adjustment control.

4. The device of claim 1, wherein the range controller further comprises at least one lower limit set device providing delayed range adjustment.

5. The device of claim 1, wherein the range controller further comprises an exponential digital to analog converter.

6. The device of claim 1, wherein the range controller further comprises a digital to analog converter and means for post digital to analog conversion noise filtering.

7. The device of claim 1, wherein the reference is optimized to result in a maximum dynamic range of the analog to digital converter.

8. A method comprising the steps of:
   A) providing an analog signal having an input level;
   B) using an operating range, converting the analog signal into a digitized representation of the analog signal;
   C) processing the digitized representation of the analog signal to determine the input level for the analog signal;
   D) comparing the input level for the analog signal with a reference signal to provide a comparison signal; and
   E) manipulating the comparison signal to adjust the operating range, wherein the operating range is a range of acceptable peak magnitude analog signals over which the analog to digital converter converts analog signals into digital signals.

9. The method of claim 8, wherein the step of processing further comprises the steps of:
   C1) filtering the digitized representation of the analog signal, providing an in-phase component and a quadrature component;
   C2) taking an absolute value of the in-phase component, providing an absolute in-phase signal;
   C3) taking an absolute value of the quadrature component, providing an absolute quadrature signal;
   C4) adding the absolute in-phase signal, and the absolute quadrature signal yielding the input level for the analog signal.

10. The method of claim 8, wherein the step of manipulating provides a digital implementation of a fast attack, slow decay operating range adjustment control.

11. The method of claim 8, wherein the step of manipulating further comprises the step of providing delayed range adjustment by at least one lower limit set device.

12. The method of claim 8, wherein the step of manipulating further comprises the step of converting the comparison signal with an exponential digital to analog converter.

13. The method of claim 8, wherein the step of manipulating further comprises the steps of digital to analog conversion of the comparison signal and post digital to analog conversion noise filtering.

14. The method of claim 8, wherein the step of manipulating further comprises the step of optimizing the reference signal to result in a maximum dynamic range of the converting step.

15. The method of claim 8, wherein the method is performed in a radio frequency (RF) receiver, wherein the RF receiver's front end gain is fixed, such that substantially no impairment to the linearity of the RF receiver.

16. A receiver comprising:
   A) means for receiving an analog signal having an input level;
   B) means, operatively coupled to the means for receiving, for converting the analog signal into a digitized representation of the analog signal using an operating range;
   C) means, operatively coupled to the means for converting, for processing the digitized representation of the analog signal to determine the input level for the analog signal;
   D) means, operatively coupled to the means for processing, for comparing the input level for the analog signal with a reference signal to provide a comparison signal; and
   E) means, operatively coupled to the means for comparing, for manipulating the comparison signal to adjust the operating range, wherein the operating range is a range of acceptable peak magnitude analog signals over which the analog to digital converter converts analog signals into digital signals.

17. The receiver of claim 16, wherein the means for manipulating provide a digital implementation of a fast attack, slow decay operating range adjustment control.

18. The receiver of claim 16, wherein the means for manipulating further comprises an exponential digital to analog converter.

19. The receiver of claim 16, wherein the means for manipulating further comprises a digital to analog converter and means for post digital to analog conversion noise filtering.

20. The receiver of claim 16, wherein the reference signal is optimized to result in a maximum dynamic range of the means for converting.

21. The receiver of claim 16, wherein the means for processing further comprises:
   C1) means for filtering the digitized representation of the analog signal, providing an in-phase component and a quadrature component;
   C2) first means, operatively coupled to the means for filtering, for taking an absolute value of the in-phase component, providing an absolute in-phase signal;
   C3) second means, operatively coupled to the means for filtering, for taking an absolute value of the quadrature component, providing an absolute quadrature signal;
   C4) means, operatively coupled to the first and second means for taking the absolute value, for adding the absolute in-phase signal and the absolute quadrature signal yielding the input level for the analog signal.

22. The receiver of claim 16, wherein the means for receiving have a fixed gain.

23. An apparatus comprising:
   A) an analog to digital converter having an analog signal input, a digitized signal output, and a range adjustment input;
   B) a level detector coupled to the digitized signal output and having a level detector output that yields an input level signal;
   C) a comparator having at least a first input coupled to the level detector output, a second input coupled to a reference, and a comparison signal output; and
   D) a range controller having an input coupled to the comparison signal output and an output coupled to the range adjustment input, and constructed to provide continuous adjustment of the range adjustment input, such that the range controller adjusts, the range of acceptable peak magnitude analog signals over which the analog to digital converter converts analog signals into digital signals.

24. A method comprising the steps of:
   A) providing an analog signal having an input level;
   B) using an operating range, converting the analog signal into a digitized representation of the analog signal;
   C) processing the digitized representation of the analog signal to determine the input level for the analog signal;
   D) comparing the input level for the analog signal with a reference signal to provide a comparison signal; and
   E) manipulating the comparison signal into a range adjustment signal that continuously adjusts the operating range, wherein the operating range is a range of acceptable peak magnitude analog signals over which the analog to digital converter converts analog signals into digital signals.

25. The method of claim 24, further comprising the step of:
   F) filtering the comparison signal to prevent nonlinearities due to switching noise in the range adjustment signal.

* * * * *